(12) United States Patent
Dake et al.

(10) Patent No.: US 7,548,097 B2
(45) Date of Patent: Jun. 16, 2009

(54) FLYBACK CURRENT CONTROL

(75) Inventors: Luthuli E. Dake, McKinney, TX (US);
Bernard Wicht, Munich (DE); Michael Herbert Wendt, Wasserburg (DE)

(73) Assignee: Texas Instruments Incorporated, Dallas, TX (US)

( * ) Notice: Subject to any disclaimer, the term of this patent is extended or adjusted under 35 U.S.C. 154(b) by 23 days.

(21) Appl. No.: 11/877,043

(22) Filed: Oct. 23, 2007

(65) Prior Publication Data
US 2009/0102547 A1    Apr. 23, 2009

(51) Int. Cl.
*H03K 3/00* (2006.01)
(52) U.S. Cl. .................. 327/110; 327/377; 361/57; 323/289
(58) Field of Classification Search .............. 327/110, 327/377; 361/57; 323/289
See application file for complete search history.

(56) References Cited

U.S. PATENT DOCUMENTS

| 5,115,369 | A  | * | 5/1992  | Robb et al. | 361/58 |
| 6,166,893 | A  | * | 12/2000 | Shen et al. | 361/86 |
| 6,804,096 | B2 | * | 10/2004 | Nagata | 361/78 |
| 7,035,120 | B2 | * | 4/2006  | Tobita | 363/21.06 |

* cited by examiner

*Primary Examiner*—Kenneth B. Wells
(74) *Attorney, Agent, or Firm*—William B. Kempler; W. James Brady; Frederick J. Telecky, Jr.

(57) ABSTRACT

One embodiment of the invention includes a power driver system. The power driver system comprises a power transistor that is activated to provide power to a load and a switching circuit configured to control the power transistor based on a control signal. The power driver system further comprises a control circuit configured to detect a flyback current from the load upon deactivation of the power transistor and to cause the switching circuit to steer the flyback current from a first flyback current path to a second flyback current path in response to detecting the flyback current path. The second flyback current path can have an impedance that is greater than the first flyback current path.

20 Claims, 2 Drawing Sheets

FLYBACK CURRENT CONTROL

TECHNICAL FIELD

This invention relates to electronic circuits, and more specifically to flyback current control.

BACKGROUND

Typical switching power supplies, such as a low-side driver, may include a power transistor that is controlled by at least one driver switch. As an example, the power transistor may be activated and deactivated based on the switching of a high-side switch and/or a low-side switch. A given power transistor can be configured to conduct a large amount of current, and can thus be large in size. Therefore, it is often desirable to implement fast turn-on and turn-off times for the power transistor based on the operation of the at least one driver switch to accommodate for activation and deactivation delays of the large power transistor. As an example, a low-side switch can be activated quickly to sink a bias node of the power transistor to ground, such that capacitance (e.g., gate-source capacitance) of the power transistor can be discharged quickly.

For a switching power driver that provides power to an inductive load, flyback current can result when the inductive load is decoupled from the power source. In this context, flyback current is current that is generated from the discharge of the magnetic field energy in the inductive load, and is channeled to a low supply power (e.g., ground), such as via the bias node of the power transistor. To minimize the flyback current, the flyback current path to ground can be a high-impedance path. However, such a high-impedance path may interfere with the dissipation of the capacitive charge of the power transistor. As a result, the power transistor may not be able to be deactivated quickly. Accordingly, a switching power driver that provides power to an inductive load may have to compromise between fast deactivation and power dissipation.

SUMMARY

One embodiment of the invention includes a power driver system. The power driver system comprises a power transistor that is activated to provide power to a load and a switching circuit configured to control the power transistor based on a control signal. The power driver system further comprises a control circuit configured to detect a flyback current from the load upon deactivation of the power transistor and to cause the switching circuit to steer the flyback current from a first flyback current path to a second flyback current path in response to detecting the flyback current path. The second flyback current path can have an impedance that is greater than the first flyback current path.

Another embodiment of the invention includes a method for limiting a flyback current in a power driver. The method comprises deactivating a power transistor based on a control signal. The power transistor can be configured to provide power to a load. The method also comprises detecting a flyback current flow from the load to a first flyback current path resulting from deactivating the power transistor. The method further comprises steering the flyback current flow from the first flyback current path to a second flyback current path in response to detecting the flyback current flow. The second flyback current path having an impedance that is greater than the first flyback current path.

Another embodiment of the invention includes a power driver system. The power driver system comprises means for controlling a power transistor based on a control signal. The power transistor can be configured to provide power to an inductive load. The power driver system also comprises means for detecting a flyback current upon the power transistor removing power from the inductive load. The power driver system further comprises means for steering the flyback current from a first flyback current path to a second flyback current path. The second flyback current path can have an impedance that is greater than the first flyback current path.

DETAILED DESCRIPTION

The invention relates to electronic circuits, and more specifically to flyback current control. A flyback current control circuit is configured to monitor a voltage across a diode residing in a flyback current path. Upon detecting flyback current, the flyback current control circuit can steer the flyback current from a first flyback current path to a second flyback current path that has a higher impedance that the first flyback current path. The first flyback current path can be a low-impedance path through a switch device in a switching circuit that is configured to control the operation of the power transistor. Thus, the switch device can be deactivated to steer the flyback current through a resistor having a higher impedance than the first flyback current path. In addition, the power transistor can be reactivated upon detecting the flyback current, such that the power transistor can also dissipate the flyback current.

Figure 1:
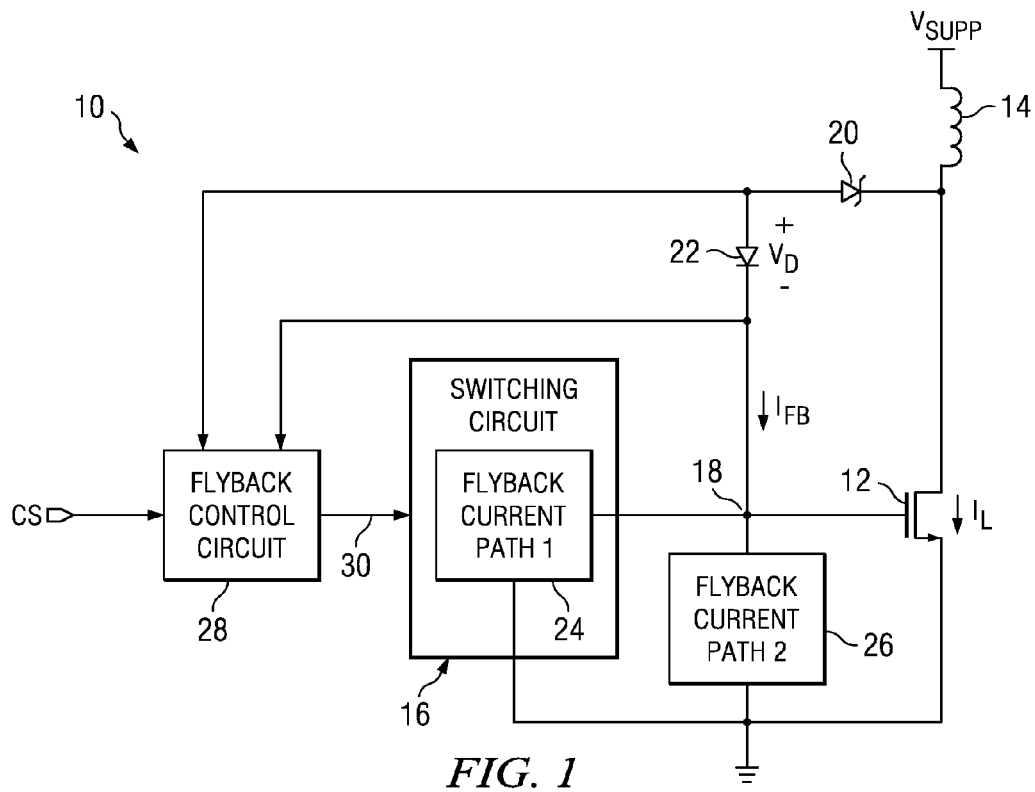
FIG. 1 illustrates an example of a power driver system in accordance with an aspect of the invention.

FIG. 1 illustrates an example of a power driver system 10 in accordance with an aspect of the invention. The power driver system 10 can be implemented in any of a variety of electronic devices, such as a portable computing or communications device. The power driver system 10 includes a power transistor 12. In the example of FIG. 1, the power transistor 12 is demonstrated as a field-effect transistor (FET). However, it is to be understood that any type of transistor can be implemented in the power driver system 10. The power transistor 12 interconnects an inductor 14 and a low supply voltage, demonstrated in the example of FIG. 1 as ground. Therefore, while activated, the power transistor 12 provides power to the inductor 14 via a power source voltage $V_{SUPP}$. Accordingly, the inductor 14 provides a current $I_L$ through the power transistor 12 to ground when the power transistor 12 is activated.

The power driver system 10 includes a switching circuit 16 that is configured to control the operation of the power transistor 12. Specifically, the switching circuit 16 is coupled to a bias node (e.g., gate) 18 of the power transistor 12. The switching circuit 16 generates bias signals at the node 18 to activate and deactivate the power transistor 12. The switching circuit 16 controls the power transistor 12 based on a control signal CS. As an example, the control signal CS can be asserted to activate the power transistor 12. For example, the switching circuit 16 can include a high-side switch and/or a low-side switch (not shown) that are respectively activated and deactivated by control signal CS. As such, the high-side switch and/or the low-side switch can respectively be operated to generate the bias signals at the bias node 18 of the power transistor 12, thus respectively activating or deactivating the power transistor 12.

Upon deactivation of the power transistor 12, magnetic energy that is stored in the inductor 14 begins to dissipate in the form of a flyback current $I_{FB}$. In the example of FIG. 1, the flyback current $I_{FB}$ flows from the inductor 14 to ground via a Zener diode 20 having a cathode coupled between the inductor 14 and the power transistor 12, through a diode 22 having an anode coupled to the anode of the Zener diode 20, and through either a first flyback current path 24 within the switching circuit 16 or a second flyback current path 26 interconnecting the bias node 18 and ground. The Zener diode 20 is configured to steer the inductor current $I_L$ through the power transistor 12 during activation of the power transistor 12, and to allow the flyback current $I_{FB}$ to flow through it while the power transistor 12 is deactivated. The diode 22 is configured to isolate the gate and the drain of the power transistor 12. The first flyback current path 24 can be included in the switching circuit 16, such as a low-impedance current path through one of the transistors (e.g., a low-side switch). The second flyback current path 26 can be a high-impedance circuit component, such as a resistor having substantially higher resistance value than the first flyback current path 24.

The power driver system 10 includes a flyback control circuit 28. The flyback control circuit 28 is configured to detect the flow of the flyback current $I_{FB}$. In the example of FIG. 1, the flyback control circuit 28 is configured to monitor a voltage $V_D$ across the diode 22. Upon the deactivation of the power transistor 12, the flyback current $I_{FB}$ will begin to flow through the diode 22. As a result, the voltage $V_D$ will be generated across the diode 22, thus indicating the flow of the flyback current $I_{FB}$ to the flyback control circuit 28. In response to detecting the voltage $V_D$, the flyback control circuit 28 enters a clamping mode of operation. Specifically, in the clamping mode of operation, the flyback control circuit 28 provides an activation signal 30 to the switching circuit 16, such that the switching circuit 16 steers the flow of the flyback current $I_{FB}$ from the first flyback current path 24 to the second flyback current path 26. For example, the flyback control circuit 28 can perform a logical operation on the control signal CS to provide the activation signal 30, thus providing control of the switching circuit 16 in conjunction with the control signal CS.

As an example, the switching circuit 16 could deactivate the low-side switch, thus halting the flow of the flyback current $I_{FB}$ through the first flyback current path 24. Therefore, because the second flyback current path 26 has a higher impedance than the first flyback current path 24, the magnitude of the flyback current $I_{FB}$ is reduced. In addition, the switching circuit 16 is capable of providing the bias node 18 with a low-impedance path to ground for deactivation of the power transistor 12. Therefore, the power driver system 10 allows for rapid activation and deactivation of the power transistor 12 during steady-state operation of the power driver system 10 while providing a high-impedance current path for the flyback current $I_{FB}$ during the clamping mode of operation.

It is to be understood that the power driver system 10 is not intended to be limited to the example of FIG. 1. As an example, the power driver system 10 is demonstrated in the example of FIG. 1 as a low-side driver power supply. However, it is to be understood that the arrangement of the power driver system 10, particularly with regard to the flyback control circuit 28 and flyback current paths 24 and 26, is not limited to use in a low-side driver power supply. Those skilled in the art thus will appreciate that the power driver system 10 can be configured in a variety of ways and for a variety of purposes based on the teachings herein.

Figure 2:
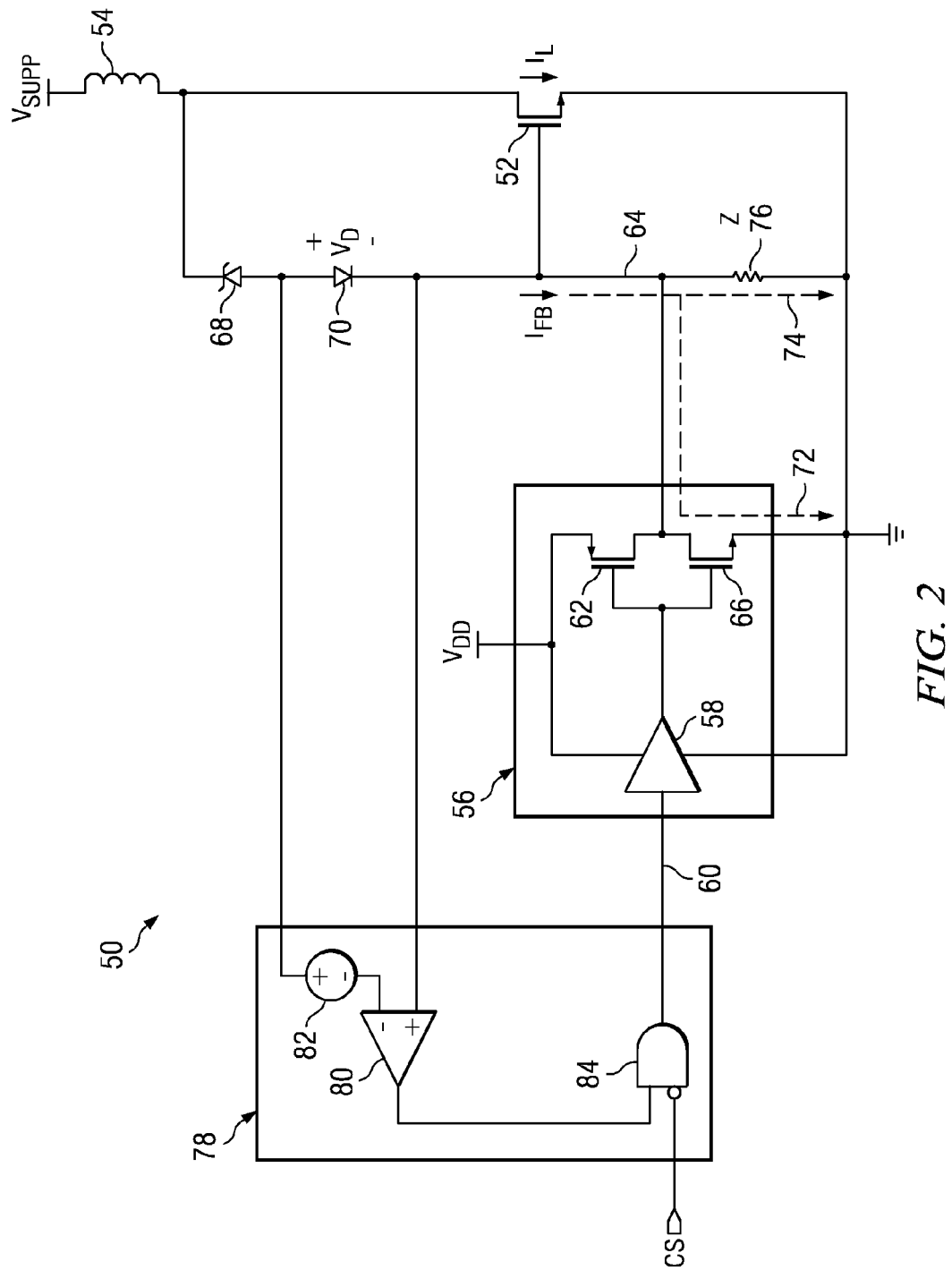
FIG. 2 illustrates another example of a power driver system in accordance with an aspect of the invention.

FIG. 2 illustrates another example of a power driver system 50 in accordance with an aspect of the invention. The power driver system 10 includes a power transistor 52, demonstrated as a power-FET in the example of FIG. 2. The power transistor 52 interconnects an inductor 54 and ground. The inductor 54 interconnects a power source voltage $V_{SUPP}$ and the power transistor 52. Therefore, upon being activated, the power transistor 52 provides power to the inductor 54 via the power source voltage $V_{SUPP}$, such that the inductor 54 provides a current $I_L$ through the power transistor 52 to ground.

The power driver system 50 includes a switching circuit 56 that is configured to control the operation of the power transistor 52. The switching circuit 56 includes a switch driver 58 configured to buffer an activation signal 60 that is associated with a control signal CS, as explained below. The buffered activation signal is provided to a high-side switch 62, demonstrated as a P-FET in the example of FIG. 2, which interconnects a positive supply voltage $V_{DD}$ and a bias node 64 of the power transistor 52. The buffered activation signal is also provided to a low-side switch 66, demonstrated as an N-FET in the example of FIG. 2, that interconnects the bias node 64 of the power transistor 52 and ground. Accordingly, upon the buffered activation signal being logic-low, the high-side switch 62 is activated to couple the bias node 64 to the positive supply voltage $V_{DD}$, thus activating the power transistor 52. Similarly, upon the buffered activation signal being logic-high, the low-side switch 66 is activated to couple the bias node 64 to ground, thus deactivating the power transistor 52.

Upon deactivation of the power transistor 52, flyback current $I_{FB}$ is generated from the inductor 54. The flyback current $I_{FB}$ flows from the inductor 14 to ground via a Zener diode 68 having a cathode coupled between the inductor 54 and the power transistor 52, through a diode 70 having an anode coupled to the anode of the Zener diode 68, and through either a first flyback current path or a second flyback current path, indicated in the example of FIG. 2 at the dashed lines 72 and 74, respectively. The first flyback current path 72 is demonstrated in the example of FIG. 2 as a path from the bias node 64 to ground through the low-side switch 66, and the second flyback current path 74 is a path from the bias node 64 to ground through a resistor 76 having a resistance value of Z. The resistance value of Z can be set substantially high, such that the resistor 76, and thus the second flyback current path 74, has a significantly greater impedance than the low-side switch 66, and thus the first flyback current path 72, when activated.

The power driver system 50 includes a flyback control circuit 78. The flyback control circuit 78 is configured to detect the flow of the flyback current $I_{FB}$ through the diode 70. The flyback control circuit 78 includes a comparator 80 having an inverting input that is coupled to an anode of the diode 70 and a non-inverting input that is coupled to a cathode of the diode 70. Upon deactivation of the power transistor 52, the flyback current $I_{FB}$ begins to flow through the diode 70, thus generating a voltage $V_D$ across the diode 70. Therefore, the comparator 80 is configured to monitor the voltage $V_D$ across the diode 70. The comparator 80 thus provides an output signal that is indicative of the presence of the flyback current $I_{FB}$. For example, the comparator 80 provides a logic-low output signal based on detecting the voltage $V_D$, and thus the flyback current $I_{FB}$.

In the example of FIG. 2, the comparator 80 is configured with an inherent offset voltage 82 at the inverting input of the comparator 80 and coupled to the anode of the diode 70. The offset voltage could have a very minimal magnitude (e.g., less than 100 mV). As a result, at times when the flyback current $I_{FB}$ is not flowing through the diode 70, the comparator 80 does not provide a false output (e.g., logic-low), such as to falsely indicate the presence of the flyback current $I_{FB}$ upon a voltage transient at the anode of the diode 70. Therefore, the offset voltage 82 helps to ensure a more accurate detection of the flyback current $I_{FB}$, thus mitigating a false positive indication.

The flyback control circuit 78 includes an AND-gate 84. The AND-gate 84 receives both the output of the comparator 80 and an inverted version of the control signal CS as inputs, and provides the activation signal 60 as an output to the driver 58. In a steady-state mode of operation, the output of the comparator 80 is logic-high. Accordingly, in the steady-state mode, when the voltage $V_D$ has not been detected to indicate the flow of the flyback current $I_{FB}$, the control signal CS is asserted to activate the high-side switch 62 and deasserted to activate the low-side switch 66, thus to activating and deactivating the power transistor 52, respectively. In a clamping mode of operation, when the voltage $V_D$ has been detected by the comparator 80, the AND-gate 84 provides the activation signal 60 as logic-low to deactivate the low-side switch 66 and to activate the high-side switch 62. Therefore, the output of the comparator 80 controls steering of the flow of the flyback current $I_{FB}$ from the first flyback current path 72 to the second flyback current path 74 via the AND-gate 84.

As an example, upon the control signal CS being deasserted in the steady-state mode, the low-side switch 66 is activated to provide a low-impedance coupling of the bias node 64 to ground. Therefore, the power transistor 52 is rapidly deactivated. In response to the deactivation of the power transistor 52, the inductor 54 provides the flyback current $I_{FB}$ through the Zener diode 68 and the diode 70, thus generating the voltage $V_D$ across the diode 70. The flyback current $I_{FB}$ begins to flow through the low-impedance low-side switch 66 along the first flyback current path 72. Upon detecting the voltage $V_D$ across the diode 70, the flyback control circuit 78 switches to the clamping mode, such that the comparator 80 provides a logic-low output signal to the AND-gate 84, which in turn provides the activation signal 60 as logic-low to the switching circuit 56. Accordingly, the low-side switch 66 is deactivated, forcing the flyback current $I_{FB}$ to flow through the resistor 76 in the second flyback current path 74. Because the resistor 76 has a significantly greater impedance than the low-side switch 66, the flyback current $I_{FB}$ is greatly reduced in magnitude. Because the flyback current $I_{FB}$ has a substantially low magnitude, the respective sizes of the Zener diode 68 and the diode 70 can be minimized as they need not be able to withstand a large magnitude of the flyback current $I_{FB}$. Accordingly, in addition to reduced power dissipation, circuit die area can be significantly reduced as well by steering the flyback current $I_{FB}$ from the first flyback current path 72 to the second flyback current path 74.

As a result of the logic-low state of the activation signal 60 from the AND-gate 84, it is to be understood that the high-side switch 62 concurrently activates with the low-side switch 66 being deactivated. The bias node 64 is thus set equal to the positive supply voltage $V_{DD}$. Therefore, in addition to the flyback current $I_{FB}$ being momentarily steered through the second flyback current path 74, the power transistor 52 becomes activated. As a result, the flyback current $I_{FB}$ is steered back through the power transistor 52 as the current $I_L$. In addition, the power transistor 52 can likewise be activated based on a voltage that is momentarily generated across the resistor 76 at the bias node 64 by the flyback current $I_{FB}$ prior to the base node 64 being pulled-up to the positive supply voltage $V_{DD}$. In either situation, the activation of the power transistor 52 allows the inductor 54 to continue to discharge the stored magnetic energy as the current $I_L$ through the power transistor 52, thus essentially eliminating the flyback current $I_{FB}$ through the Zener diode 68. Accordingly, the control (i.e., activation and deactivation) of the power transistor 52 is based on the switching circuit 56, which is in turn controlled by both the flyback control circuit 78 and the control signal CS.

It is to be understood that the power driver system 50 is not intended to be limited to the example of FIG. 2. As an example, the power driver system 50 is demonstrated in the example of FIG. 2 as a low-side driver power supply. However, it is to be understood that the arrangement of the power driver system 50, particularly with regard to the flyback control circuit 78 and flyback current paths 72 and 74, is not limited to use in a low-side driver power supply. Those skilled in the art thus will appreciate that the power driver system 10 can be configured in a variety of ways and for a variety of purposes based on the teachings herein.

Figure 3:
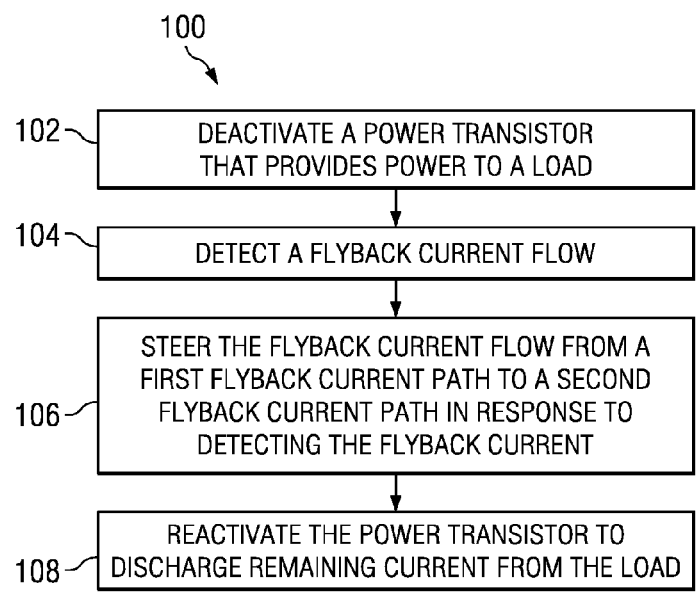
FIG. 3 illustrates an example of a method for limiting a flyback current in a power driver system in accordance with an aspect of the invention.

In view of the foregoing structural and functional features described above, certain methods will be better appreciated with reference to FIG. 3. It is to be understood and appreciated that the illustrated actions, in other embodiments, may occur in different orders and/or concurrently with other actions. Moreover, not all illustrated features may be required to implement a method.

FIG. 3 illustrates an example of a method 100 for limiting a flyback current in a power driver system in accordance with an aspect of the invention. At 102, a power transistor that provides power to a load is deactivated. The load can be an inductive load (e.g., a motor or other inductive load), and the deactivation of the power transistor can be based on the operation of a switching circuit. The switching circuit can include a high-side switch and/or a low-side switch that is controlled by a control signal. At 104, a flyback current flow is detected. The flyback current can be based on the inductive load generating current from dissipating magnetic energy. The detection of the flyback current flow can be based on monitoring a voltage across a diode that is coupled to a bias node of the power transistor. An offset voltage can be applied upstream of the diode to mitigate false detection of the flyback current.

At 106, the flyback current flow is steered from a first flyback current path to a higher impedance second flyback current path in response to detecting the flyback current. The first flyback current path can be through a low-side switch in the switching circuit that activates and deactivates the power transistor. The second flyback current path can include a resistor having a impedance (e.g., resistance) magnitude that is substantially greater than the impedance through the low-side switch when it is activated. At 108, the power transistor is reactivated to discharge remaining current from the load. The reactivation of the power transistor can result from the power transistor being biased by a high-side switch and or a voltage induced by the flyback current across the second flyback current path. The current from the load can be remaining magnetic energy stored in the inductive load, such that the flyback current ceases to flow and is thus converted into load current through the power transistor.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A power driver system comprising:
   a power transistor that is activated to provide power to a load;
   a switching circuit configured to control the power transistor based on a control signal; and
   a control circuit configured to detect a flyback current from the load upon deactivation of the power transistor and to cause the switching circuit to steer the flyback current from a first flyback current path to a second flyback current path in response to detecting the flyback current, the second flyback current path having an impedance that is greater than the first flyback current path.

2. The system of claim 1, wherein the load is an inductive load.

3. The system of claim 1, wherein the switching circuit comprises a high-side switch and a low-side switch connected in series between a high supply voltage and a low supply voltage and interconnected by a control node, the control node being coupled to a bias terminal of the power transistor, the control circuit controlling the operation of the high-side switch and the low-side switch.

4. The system of claim 3, wherein the first flyback current path comprises the low-side switch and the second flyback current path comprises a resistor connected between the control node and the low supply voltage in parallel with the low-side switch, the control circuit being configured to deactivate the low-side switch in response to detecting the flyback current.

5. The system of claim 4, wherein the switching circuit is further configured to activate the high-side switch in response to detecting the flyback current, the power transistor being activated in response to the activation of the high-side switch.

6. The system of claim 1, further comprising a diode that interconnects the load and a bias node of the power transistor, the switching circuit being coupled to the bias node, wherein the control circuit comprises a comparator configured to detect the flyback current across the diode.

7. The system of claim 6, wherein the control circuit further comprises an AND-gate that receives the control signal and an output of the comparator as inputs, the AND-gate being coupled to provide an output signal to the switching circuit to steer the flyback current from the first flyback current path to the second flyback current path as a function of the control signal and the output of the comparator.

8. The system of claim 7, wherein the comparator is configured to provide an offset voltage from an input of the comparator to an anode of the diode, the offset voltage having a magnitude that is set to substantially mitigate false detection of the flyback current.

9. A method for limiting a flyback current in a power driver, the method comprising:
   deactivating a power transistor based on a control signal, the power transistor being configured to provide power to a load;
   detecting a flyback current flow from the load to a first flyback current path resulting from deactivating the power transistor; and
   steering the flyback current flow from the first flyback current path to a second flyback current path in response to detecting the flyback current flow, the second flyback current path having an impedance that is greater than the first flyback current path.

10. The method of claim 9, wherein the load is an inductive load interconnecting a supply voltage and the power transistor.

11. The method of claim 9, wherein deactivating the power transistor occurs in response to activating a low-side switch connected between a bias terminal of the power transistor and ground to couple the bias terminal of the power transistor to ground.

12. The method of claim 11, wherein steering the flyback current flow comprises deactivating the low-side switch to steer current through a resistor that is connected in parallel with the low-side switch between the bias terminal and ground.

13. The method of claim 9, wherein detecting the flyback current flow comprises detecting a voltage across a diode connected between the load and a bias node of the power transistor and providing the flyback current to both the first flyback current path and the second flyback current path.

14. The method of claim 13, further comprising providing an offset voltage to an anode of the diode to substantially mitigate false detection of the flyback current based on the detected voltage across the diode.

15. The method of claim 9, wherein steering the flyback current flow comprises performing a logic AND operation on the control signal and a signal that is indicative of the detected flyback current flow to control steering the flyback current flow from the first flyback current path to the second flyback current path.

16. A power driver system comprising:
    means for controlling a power transistor based on a control signal, the power transistor being configured to provide power to an inductive load;
    means for detecting a flyback current upon the power transistor removing the power from the inductive load; and
    means for steering the flyback current from a first flyback current path to a second flyback current path, the second flyback current path having an impedance that is greater than the first flyback current path.

17. The system of claim 16, wherein the means for controlling the power transistor comprises means for deactivating the power transistor, the means for deactivating the power transistor forming a portion of the first flyback current path connected between a bias node of the power transistor and ground.

18. The system of claim 17, wherein the means for steering the flyback current is configured to provide an activation signal to the means for controlling in response to detecting the flyback current, the means for controlling being further configured to deactivate the means for deactivating the power transistor in response to the control signal.

19. The system of claim 16, wherein the means for detecting the flyback current comprises means for detecting a voltage drop across a diode connected between the load and a bias node of the power transistor and providing the flyback current to both the first flyback current path and the second flyback current path.

20. The system of claim 19, wherein the means for detecting the flyback current comprises means for providing an offset voltage to an anode of the diode to substantially mitigate false detection of the flyback current.

* * * * *